US010008521B2

(12) United States Patent
Sekine

(10) Patent No.: US 10,008,521 B2
(45) Date of Patent: Jun. 26, 2018

(54) SOLID-STATE IMAGING DEVICE

(71) Applicant: SETECH CO., LTD., Kanagawa (JP)

(72) Inventor: Hirokazu Sekine, Kanagawa (JP)

(73) Assignee: SETECH CO., LTD., Kanagawa (JP)

( * ) Notice: Subject to any disclaimer, the term of this patent is extended or adjusted under 35 U.S.C. 154(b) by 0 days. days.

(21) Appl. No.: 14/897,911

(22) PCT Filed: Sep. 6, 2014

(86) PCT No.: PCT/JP2014/073590
§ 371 (c)(1),
(2) Date: Dec. 11, 2015

(87) PCT Pub. No.: WO2015/037547
PCT Pub. Date: Mar. 19, 2015

(65) Prior Publication Data
US 2016/0111457 A1    Apr. 21, 2016

(30) Foreign Application Priority Data
Sep. 10, 2013    (JP) .................................. 2013-186823

(51) Int. Cl.
*H01L 27/144*    (2006.01)
*H01L 27/146*    (2006.01)

(52) U.S. Cl.
CPC ...... *H01L 27/1446* (2013.01); *H01L 27/1461* (2013.01); *H01L 27/14607* (2013.01);
(Continued)

(58) Field of Classification Search
CPC ........... H01L 27/1464; H01L 27/14647; H01L 27/14689
(Continued)

(56) References Cited

U.S. PATENT DOCUMENTS 5,965,875 A    10/1999 Merrill
2007/0131987 A1    6/2007 Kim
(Continued)

FOREIGN PATENT DOCUMENTS

EP    2133918 A2    12/2009
JP    07-074340    3/1995
(Continued)

OTHER PUBLICATIONS

International Search Report dated Dec. 9, 2014 from corresponding International Patent Application No. PCT/JP2014/073590; 2 pgs.
(Continued)

*Primary Examiner* — Jonathan Han
(74) *Attorney, Agent, or Firm* — Maier & Maier, PLLC

(57) ABSTRACT

A backside illumination-type solid-state imaging device is provided in which an amount of accumulated charge of a photodiode is increased and a read out path of a stacked-type photodiode is simplified. A photodiode of a backside illumination-type solid-state imaging device is made to be of an accumulation gate structure, and thereby the amount of accumulated charge and sensitivity are increased. Further, a barrier region is provided in the direction of incident light so as to separate the photodiode, and the height of barrier at the barrier region is controlled by a pulse voltage applied to the accumulation gate, so that transfer of signal charges between the stacked-type photodiodes separated in the direction of incident light is controlled, making reading out of the stacked-type photodiode simple.

3 Claims, 8 Drawing Sheets

(52) U.S. Cl.
CPC .. *H01L 27/14612* (2013.01); *H01L 27/14614* (2013.01); *H01L 27/14643* (2013.01); *H01L 27/14647* (2013.01)

(58) Field of Classification Search
USPC ............ 257/E27.133, E27.135, E27.15, 443; 348/294; 250/208.1
See application file for complete search history.

(56) References Cited

U.S. PATENT DOCUMENTS

| | | | |
|---|---|---|---|
| 2008/0076202 | A1 | 3/2008 | Suzuki et al. |
| 2008/0283726 | A1* | 11/2008 | Uya .................. H01L 27/14603 250/208.1 |
| 2009/0303371 | A1 | 12/2009 | Watanabe et al. |
| 2010/0176277 | A1 | 7/2010 | Kubodera et al. |
| 2010/0230583 | A1 | 9/2010 | Nakata et al. |
| 2011/0181749 | A1* | 7/2011 | Yamada .............. H01L 27/1461 348/222.1 |
| 2012/0242875 | A1 | 9/2012 | Nakamura |
| 2013/0001730 | A1 | 1/2013 | Miyanami |
| 2013/0026594 | A1 | 1/2013 | McCarten et al. |
| 2013/0234029 | A1* | 9/2013 | Bikumandla ......... H01L 25/043 250/349 |
| 2014/0151533 | A1 | 6/2014 | Watanabe et al. |

FOREIGN PATENT DOCUMENTS

| | | |
|---|---|---|
| JP | 2003031785 A | 1/2003 |
| JP | 2007-165886 A | 6/2007 |
| JP | 2007-194488 A | 8/2007 |
| JP | 2007-258684 | 10/2007 |
| JP | 2010-141045 A | 6/2010 |
| JP | 2010-161254 A | 7/2010 |
| JP | 2013-012556 A | 1/2013 |

OTHER PUBLICATIONS

Japanese Office Action from corresponding Japanese Patent Application No. 2013-186823; 6 pgs.

Extended European Search Report dated Aug. 4, 2016, including the Supplementary European Search Report and the European Search Opinion, in connection with corresponding EP Application No. 14843942.5 (7 pgs.).

Korean Office Action dated Jan. 20, 2017, in connection with corresponding KR Application No. 10-2015-7035335 (8 pgs., including English translation).

* cited by examiner

SOLID-STATE IMAGING DEVICE

TECHNICAL FIELD

The present invention relates to a structure of a backside illumination-type solid-state imaging device and an operation method of the same.

BACKGROUND

Solid-state imaging devices are classified broadly into two categories: a charge transfer-type solid-state imaging element represented by a CCD sensor and an X-Y address-type solid-state imaging element represented by a CMOS sensor. In the following description, an explanation will be given on a CMOS sensor as the solid-state imaging device. In recent years, in order to establish both reduction in pixel size involved in increase in number of pixels and enhancement of sensitivity, CMOS sensors of a backside illumination type are becoming mainstream rapidly. Each pixel cell of a CMOS sensor is provided with a photoelectric conversion portion which generates a signal charge in response to incident light (hereafter, referred to as a pixel) and an amplification portion which converts the signal charge of the photoelectric conversion portion into a signal voltage and amplifies it.

For a structure of a CMOS sensor of the backside illumination type, after a wafer process of the CMOS sensor is completed, the wafer of the CMOS sensor is attached to a substrate supporting member, film thinning process is performed on the backside of the sensor, and a color filter is formed on the backside to complete the structure. An example of such structures and manufacturing methods are described in Patent Document 1.

In the CMOS sensor of the backside illumination type, the pixel portion performing photoelectric conversion is formed of a photodiode, and shielded with an impurity region of a conductivity type opposite to that of the photodiode, to suppress a dark time output due to an effect of a silicon interface. Therefore, electric potential of the photodiode cannot be controlled externally. Reading out of the charge accumulated by the photodiode is performed by changing electric potential below a transfer gate which is provided adjacent to the photodiode. Deterioration of image quality caused by reduction in an amount of the signal charge that can be accumulated by the photodiode in accordance with reduction of the pixel size has become a problem.

On the other hand, an image sensor of a stacked photodiode type, with a common name of Foveon sensor, is known (Patent Document 2). This sensor has a structure which generates and accumulates signal charges corresponding to wavelengths of incident light through photoelectric conversion by photodiodes disposed at different locations in the depth direction, and has independent read out paths for reading out independently the signal charges corresponding to the wavelengths of incident light. Since each cell has to be provided with an independent read out path, there is a problem that miniaturization of the cells is inhibited.

A structure of a stacked-type photodiode image sensor is shown in Patent Document 3 which is similarly configured as above and where three primary colors, i.e., R (red), G (green) and B (blue), are made to correspond to photodiodes at individual depth. With this structure, it is also necessary to form read out paths for reading out signal charges independently that correspond to wavelengths of incident light, so that there is similarly a problem of inhibiting miniaturization of the cells. Incidentally, Patent Document 3 was proposed by the present inventors.

In CCD sensors, a global shutter having synchronism is easy since CCD registers are provided to transfer signal charges, whereas, in CMOS sensor, a rolling shutter mode is necessitated in which pixel signals are read out sequentially, so that it is impossible to realize a global shutter. For this reason, there is a problem of a so-called rolling shutter distortion where an image is distorted with respect to a moving object. In order to prevent the rolling shutter distortion, it is necessary to add a primary accumulation region adjacently in a lateral direction, resulting in a problem of pixel size increase.

In fine pixels of recent years, a backside illumination-type solid-state imaging device (hereafter, explanations are given on a CMOS sensor of a backside illumination type) are frequently used. A backside illumination-type imaging device can condense incident light from the back side thereof onto a photodiode. In this structure, since there is no wiring layer on the back side, availability of light is enhanced through reduction of loss in incident light signal by making a distance from a micro lens to the photodiode short. In the backside illumination-type solid-state imaging device, a substrate supporting member is attached to a surface on the side of reading out of signal charges, where wiring is provided, and CMP (Chemical Mechanical Polishing) or etching is applied to the back side of the wafer, to reduce a thickness of the wafer, i.e., to achieve film thinning. Due to this film thinning, spectral sensitivity characteristics equivalent to those of a conventional front side illumination-type solid-state imaging device are obtained. For the photodiode of the backside illumination-type solid-state imaging device, a configuration is proposed in Patent Document 4 in which, in order to increase charge accumulation capacity, an accumulation gate is provided which has a MOS-type structure with a gate insulator film interposed on the surface of the photodiode on the side of reading out of signal charges. According to this structure, it is possible to increase charge accumulation capacity by the photodiode, however, it is not possible to accumulate a plurality of signal charges separately.

PRIOR ART DOCUMENTS

Patent Documents

Patent Document 1: Japanese Unexamined Patent Application Publication No. 2003-31785
Patent Document 2: U.S. Pat. No. 5,965,875
Patent Document 3: Japanese Unexamined Patent Application Publication No. H7-74340
Patent Document 4: Japanese Unexamined Patent Application Publication No. 2010-141045

SUMMARY

Problems to be Solved by the Invention

An object of the present invention is to provide a backside illumination-type solid-state imaging device in which a plurality of charges can be accumulated independently in each pixel. Another object of the present invention is to provide, by adopting this configuration, a backside illumination-type solid-state imaging device that has increased number of pixels and is suitable to high integration without need for additional circuit area for reading out, in which signal charges of photodiodes having different spectral characteristics are accumulated independent by a pixel at the same position and the charges of the photodiodes in a stacking direction are read out independently by a same circuit. According to this configuration, it is also possible to achieve a global shutter without any laterally adjacent accumulation portion.

Means to Solve the Problem

In order to solve the problems, further in the CMOS sensor of a backside illumination type of the invention, at a midway region in a thickness direction of a photodiode of a pixel portion performing photoelectric conversion, an impurity region having a conductivity opposite to that of the photodiode is provided so that a plurality of regions separated in the vertical direction (hereafter referred to as a stacked-type photodiode) are formed in the photodiode. With this configuration, it is possible to accumulate independently signal charges generated depending on wavelengths of the incident light and to read out independently the signal charges accumulated in the stacked-type photodiode, as well as to control transfer of charges between the photodiodes stacked vertically by means of a voltage applied to an accumulation gate.

Advantageous Effect of the Invention

According to the present invention, in a CMOS sensor of a backside illumination type, an amount of charge accumulated in a photodiode can be increased. Since transfer of charges between the vertical photodiodes can be controlled by the accumulation gate, an image sensor of a stacked-type photodiode in which no additional read out path is required can be provided. Moreover, a solid-state imaging device which can achieve a global shutter can be provided that has no laterally adjacent accumulation portion.

DETAILED DESCRIPTION OF PREFERRED EMBODIMENTS

Figure 1:
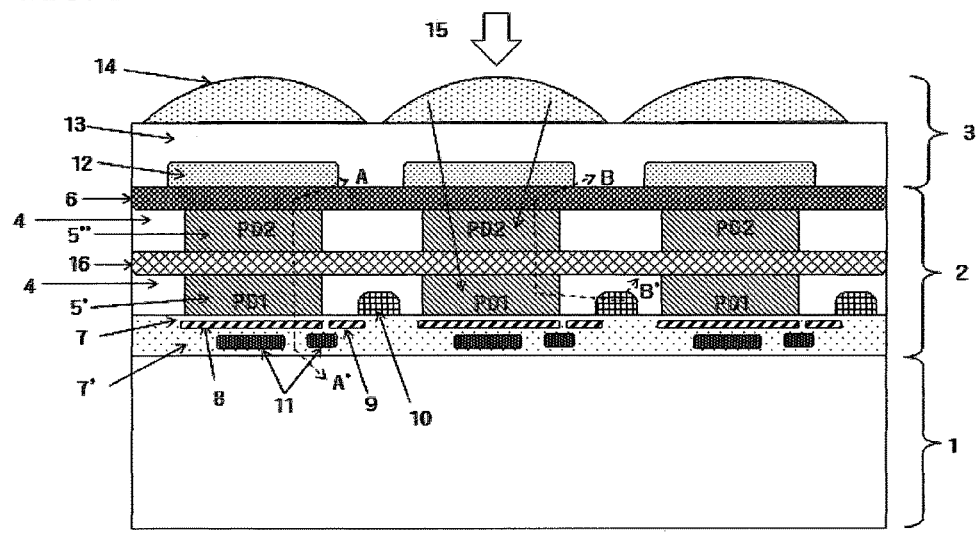
FIG. 1 is a schematic structure view of a CMOS sensor of a backside-illumination type according to a first embodiment of the present invention.

Hereafter, structures and driving methods of CMOS sensors of a backside illumination type according to embodiments of the present invention will be described with reference to the drawings. In the following description, same parts will be denoted by a same reference symbol and a same name, a detailed explanation thereof will be given first, and duplicated explanations of the same parts will be omitted. In the drawings, abbreviations are used for explanation.

First Embodiment

FIG. 1 is a schematic structure view showing an example of a CMOS sensor according to a first embodiment of the present invention, and a cross sectional view showing an example of a structure of a pixel portion. In the figure, the CMOS sensor is attached, with a wiring layer facing downward, onto a substrate supporting member 1, and film thinning is performed by CMP (Chemical Mechanical Polishing) or etching on a back surface of a wafer of the CMOS sensor, to form a sensor layer 2 of a thickness of about 5-10 μm. A color filter layer 3 is formed on the sensor layer 2.

In a P-well layer 4 of a p-type impurity region, pixel portions are arranged which are each formed of photodiodes 5', 5" (hereafter abbreviated to PD in the drawings) of an n-type impurity region. The photodiode is provided, in a region midway in a thickness direction, with an impurity region 16 having an opposite conductive type (p-type) to that of the photodiode, resulting in a structure in which the photodiode is separated in the vertical direction so as to form a plurality of regions (hereafter referred to as a stacked-type photodiode).

The stacked-type photodiode is denoted, in FIG. 1, as a stacked-type photodiode 5' on a side of the wiring and a stacked-type photodiode 5" on a side of incident light. Hereafter, they are abbreviated to PD1 and PD2 in the drawings. An upper portion of the stacked-type photodiode 5" (PD2) on the side of incident light is shielded with an impurity region 6 (hereafter referred to as a surface shield layer) of an opposite conductivity type to that of the stacked-type photodiode. The surface shield layer 6 is maintained at zero electric potential, affording a structure to suppress degradation of a dark time output due to an effect of a silicon interface. The stacked-type photodiodes 5' and 5" are isolated elementally by the P-well layer 4. The P-well layer 4 is coupled with the surface shield layer maintained at zero electric potential to achieve element isolation. An element isolation region may be formed additionally within the P-well layer 4 in order to enhance element isolation further.

On a surface of a lower portion (on the side of the wiring) of the stacked-type photodiode 5' (PD1) in FIG. 1, a MOS transistor gate (hereafter referred to as an accumulation gate 8) is arranged via a gate insulator film 7, and a transfer gate 9 is arranged adjacent to the accumulation gate 8, and further, a floating junction 10 is provided adjacent to the transfer gate 9. At the floating junction 10, an amount of a signal charge is detected and externally output via an output circuit (not shown) and via a vertical signal line (not shown) and a horizontal signal line (not shown). A wiring layer 11 is formed on the accumulation gate 8 and the transfer gate 9 via an insulator film 7', which is used for driving the gate and as a signal line and a power supply line. A sensor layer 2 is configured as described above.

On the surface shield layer 6 on the upper portion (on the side of incident light) of the stacked-type photodiode 5" (PD2) in FIG. 1, a color filter layer 3 is formed. The color filter layer 3 consists of color filters 12 formed to correspond to individual pixels, a transparent layer 13, and micro lenses 14. Incident light 15 is condensed on the photodiodes 5' and 5" by way of the micro lenses 14.

A structure of the stacked-type photodiodes 5', 5" at the section A-A' in FIG. 1 is shown in FIG. 2(a) and a profile of an electric potential well along the structure is shown in FIGS. 2(b) and 2(c). Electric potential wells when a negative voltage is applied and when a positive voltage is applied to the accumulation gate (hereafter abbreviated to ST in the drawings) 8 are shown in FIGS. 2(b) and 2(c), respectively. In the figures, electric potential of the accumulation gate is also shown. Electric potential of the surface shield layer 6 is set at zero, and a level of zero electric potential is shown by the horizontal broken line.

The impurity region 16 to separate the stacked-type photodiodes 5' and 5" vertically in FIG. 1 will be hereafter referred to as a barrier region 16. The impurity concentration of the barrier region 16 is set at a concentration which is sufficiently high to electrically separate the signal charges accumulated by the stacked-type photodiodes 5' and 5", as well as sufficiently low for an electric potential barrier of the barrier portion to be canceled by a voltage change of the accumulation gate. In FIG. 1, the impurity region 16 is drawn to be continuous in the horizontal direction, however, a configuration may be adopted in which impurity regions for individual pixels are formed independently.

A structure of the stacked-type photodiodes 5' and 5" at the section A-A' in FIG. 1 is shown in FIG. 2(a) and a profile of an electric potential well along the structure is shown in FIGS. 2(b) and 2(c). Electric potential wells when a negative voltage is applied and when a positive voltage is applied to the accumulation gate 8 are shown in FIGS. 2(b) and 2(c), respectively, in which the electric potential wells are represented as ST negative voltage and ST positive voltage. In the figures, electric potential of P-well and the surface shield layer 6 is set at zero, and the level of zero electric potential is shown by the horizontal broken line.

As shown in FIG. 2(b), when a sufficiently negative voltage (e.g., −1 to −2 V) is applied to the accumulation gate 8, electric potential of the silicon interface becomes zero. Even if an absolute value of the negative voltage is made larger, positive holes are injected in the interface from neighboring P-well regions (coupled with the surface shield layer and maintained at zero electric potential) for element isolation, so that the electric potential of the silicon interface on a surface on the side of the wiring of the photodiode 5 (surface on the left side in FIG. 2(a)) is kept at zero. This state is called as surface pinning. In this state, there is no effect from the silicon interface so that dark time output of the stacked-type photodiode 5' is suppressed. On the other hand, a surface portion of the stacked-type photodiode 5" on the side of incident light (surface on the right side in FIG. 2(a)) is in contact with the surface shield layer 6 that is maintained at zero electric potential. The profile of electric potential well at the stacked-type photodiodes 5' and 5" and the barrier region 16 in this state is as shown in FIG. 2(b), and the electric potential wells of the stacked-type photodiodes 5' and 5" are separated by the electric potential barrier of the barrier region 16.

As shown in FIG. 1, the barrier region 16 is coupled to the P-well layer for element isolation which is maintained at zero electric potential, however, since thickness in the depth direction is small and impurity concentration is set to be low, when depletion layers extending from the stacked-type photodiodes 5' and 5" existing above and below to the barrier region are coupled, the electric potential of the barrier region 16 floats from zero into the state of FIG. 2(b). This state is called as a punch-through state. In such a state, the electric potential of the barrier region 16 is determined by electric potential profiles of the stacked-type photodiodes 5' and 5" existing on both sides thereof. In FIG. 2(b), a negative voltage is applied to the accumulation gate 8 (in the figure, represented as ST negative voltage).

The surface portion on the side of incident light of the stacked-type photodiode 5" (in FIG. 2(a), the surface on the right side) is in contact with the surface shield layer 6 maintained at zero electric potential. Meanwhile, when a positive voltage is applied to the accumulation gate 8 (in the figure, represented as ST positive voltage), the electric potential well of the stacked-type photodiode 5' becomes deeper. As a result, the electric potential barrier of the barrier region 16 becomes significantly small as shown in FIG. 2(c), so that it is possible to make vertical transfer of charges between the photodiodes (from PD2 to PD1) not hindered.

As shown in FIG. 2(c), when a positive voltage is applied to the accumulation gate 8 (for example, 2.8 to 3.6 V in a 1.1 µm fine pixel sensor), electric potential of the surface portion on the side of wiring of the stacked-type photodiode 5' (surface on the left side of FIG. 2(a)) becomes deeper. The surface portion on the side of incident light of the photodiode 5" (the surface on the right side of FIG. 2(a)) is in contact with the surface shield layer 6 maintained at zero electric potential, so that even when the positive voltage of the accumulation gate 8 is large, electric potential change of that surface portion is small due to an effect of the zero electric potential of the surface shield layer 6. Thus, the well of electric potential of the photodiode 5 is determined depending on the voltage (0 to 3.6 V) applied to the accumulation gate, and a saturation signal amount can be controlled by the profile of the electric potential well, i.e., by adjusting the voltage (0 to 3.6 V) applied to the accumulation gate with respect to the electric potential of the surface shield maintained at zero electric potential. When the accumulation gate is in the positive voltage state, though dark time output (dark current) at the photodiode 5' is increased due to an effect of the silicon interface, it has no influence on image quality because the state occurs in a bright shooting scene in which it is preferable to increase the saturation signal amount. In a bright shooting scene, a light shot noise is dominant. Therefore, according to the configuration of the present invention, it is possible to increase an amount of accumulated charges without lowering S/N.

Figure 3:
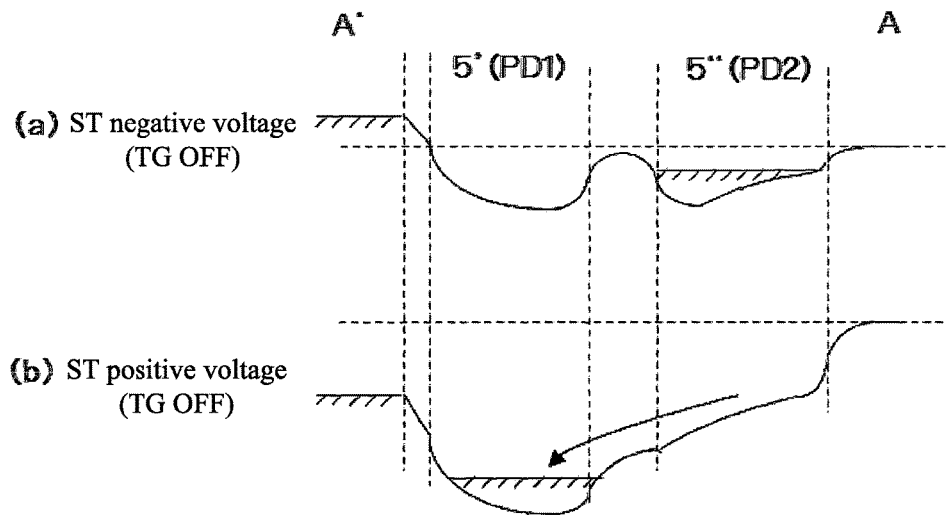
FIG. 3 is a chart to explain a method of transferring a signal charge between photodiodes of a stacked type with the electric potential well distribution of FIG. 2.

FIGS. 3(*a*) and 3(*b*) are charts to explain how a charge is transferred between the stacked-type photodiodes 5' and 5".

Figure 2:
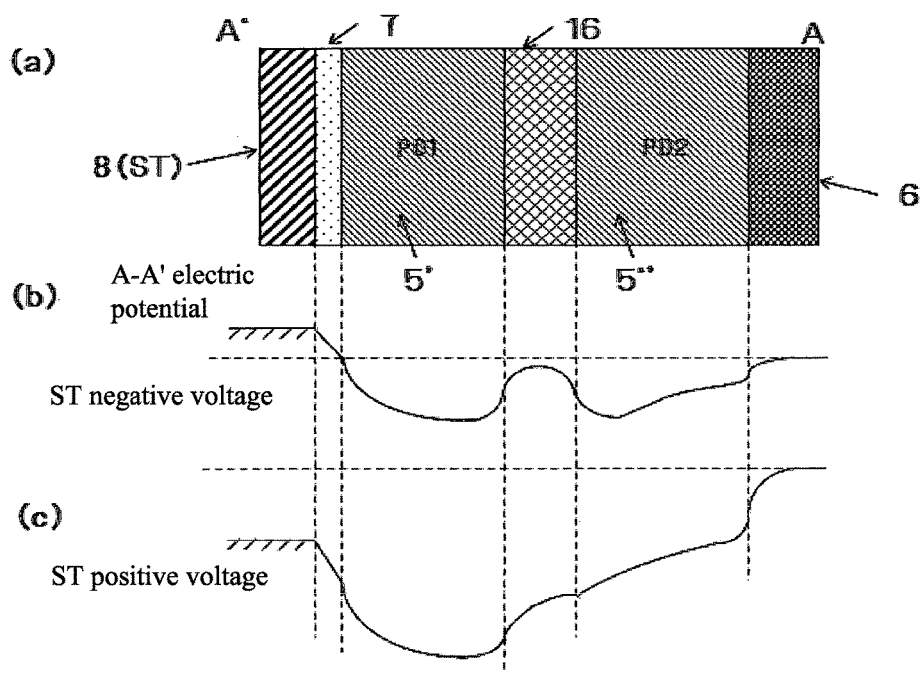
FIG. 2 is a chart showing a cross-sectional structure view at AA' of Example 1 of FIG. 1 and an electric potential well distribution corresponding to each region.

FIG. 3(*a*) shows a state in which, in a state where a negative voltage or a zero voltage is applied to the transfer gate 9 as shown in FIG. 2(*b*), a negative voltage is applied to the accumulation gate 8 (in the figure, represented as ST negative voltage/(TG OFF)), no signal charge is accumulated in the stacked-type photodiode 5' (PD1 in the figure), and a signal charge is accumulated in the other stacked-type photodiode 5" (PD2 in the figure). An amount of a signal charge accumulated in the electric potential well of the stacked-type photodiode 5' is shown by the hatching similarly to a water level. In the following figures, similar illustrations are used.

FIG. 3(*b*) shows a manner in which the signal charge of the stacked-type photodiode 5" (PD2 in the figure) is transferred to the other stacked-type photodiode 5' (PD1 in the figure). In a state where a negative voltage or a zero voltage is applied to the transfer gate 9, a positive voltage is applied to the accumulation gate 8 (in the figure, represented as ST positive voltage/(TG OFF)), and the electric potential well of the stacked-type photodiode 5' (PD1 in the figure) is deepened. At this time, the electric potential barrier of the barrier region 16 is, as shown in FIG. 2(*c*), set at a state where charge transfer is not hindered, the signal charge accumulated in the stacked-type photodiode 5" is transferred to the stacked-type photodiode 5' by way of the barrier region 16 which was once a barrier.

Figure 4:
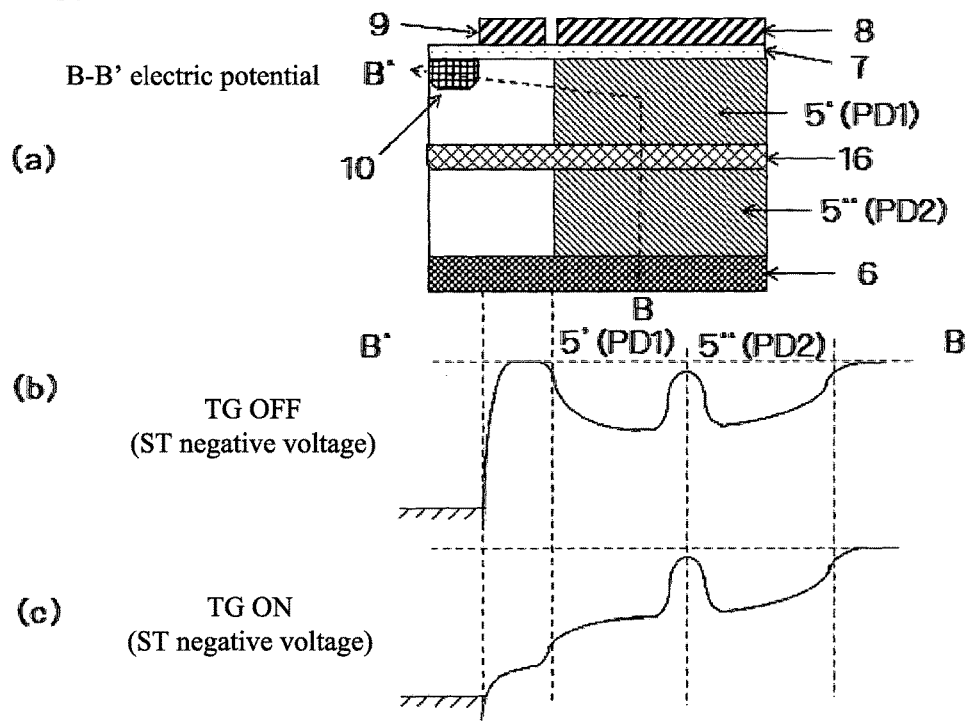
FIG. 4 is a chart showing a cross-sectional structure view at BB' of Example 1 of FIG. 1 and an electric potential well distribution corresponding to each region.

The structure of the stacked-type photodiodes 5', 5", the transfer gate 9 and the floating junction 10 at the section B-B' in FIG. 1 of the first embodiment of the present invention is shown in FIG. 4(*a*), and a profile of an electric potential well along the section B-B' is shown in FIGS. 4(*b*) and 4(*c*). FIG. 4(*b*) shows a profile of the electric potential well when a negative voltage is applied to the accumulation gate 8 and a negative voltage or a zero voltage is applied to the transfer gate 9 (in the figure, represented as TG OFF/(ST negative voltage)), and FIG. 4(*c*) shows a profile of the electric potential well when a positive voltage is applied to the transfer gate 9 while the accumulation gate 8 is kept at a negative voltage (in the figure, represented as TG OFF/(ST negative voltage)). In the figures, electric potential of the floating junction is also shown.

Figure 5:
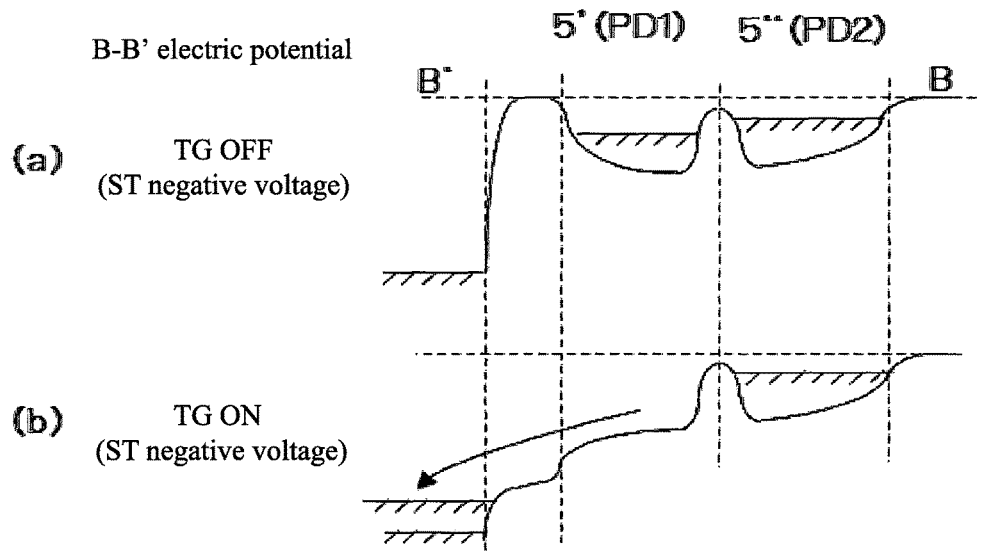
FIG. 5 is a chart to explain a method of reading out a signal charge with the electric potential well distribution of FIG. 4.

As shown in FIG. 5(*a*), in a case where a negative voltage is applied to the accumulation gate 8 and a negative voltage or a zero voltage is applied to the transfer gate 9 (in the figure, represented as TG OFF/(ST negative voltage)), signal charges generated by photoelectric conversion are accumulated in the stacked-type photodiodes 5', 5" below the accumulation gate 8.

Next, as shown in FIG. 5(*b*), when a positive voltage is applied to the transfer gate 9 while the accumulation gate 8 is kept at a negative voltage to deepen the electric potential well below the transfer gate 9 (in the figure, represented as TG ON/(ST negative voltage)), the signal charge of the stacked-type photodiode 5' among the signal charges accumulated in the stacked-type photodiodes 5', 5" below the accumulation gate 8 is transferred into the floating junction 10 by way of a portion blow the transfer gate 9. On the other hand, the signal charge of the stacked-type photodiode 5" is maintained as it is by the electric potential barrier of the barrier region 16.

Figure 6:
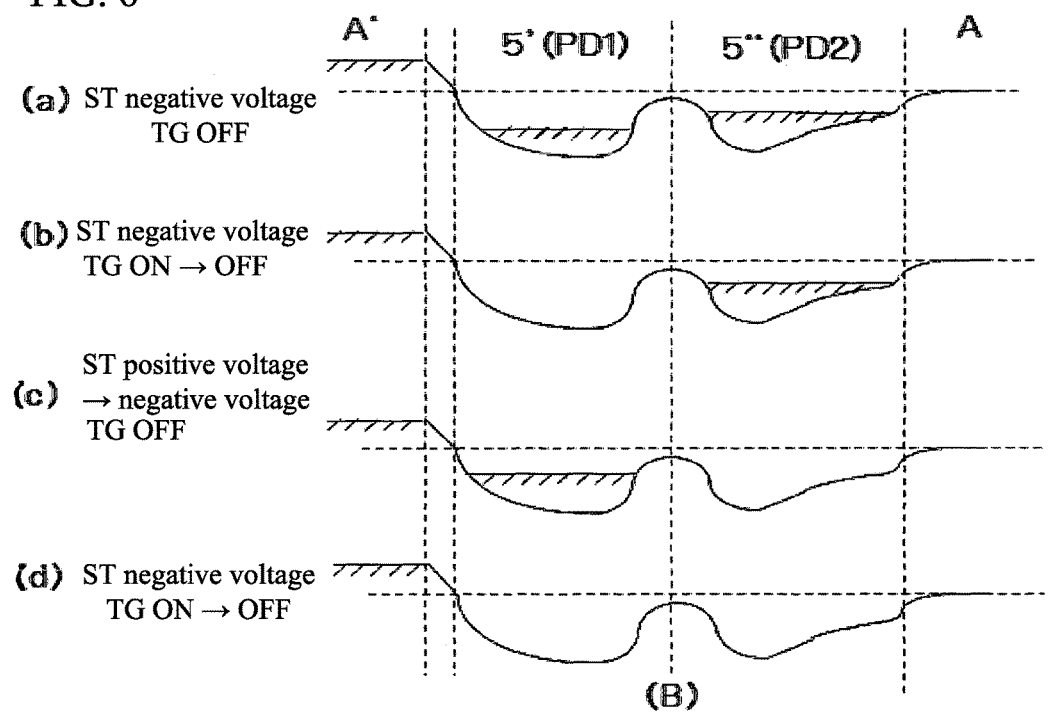
FIG. 6 is a chart to explain a transfer sequence of a signal charge between stacked-type photodiodes in which the methods of transferring a charge of FIGS. 3 and 5 are combined.

FIGS. 6(*a*)-6(*d*) are charts to explain how a charge is transferred between the stacked-type photodiodes 5', 5". FIG. 6(*a*) shows a state in which signal charges generated by photoelectric conversion in the case where, similarly to FIG. 5(*a*), a negative voltage is applied to the accumulation gate 8 and a negative voltage or a zero voltage is applied to the transfer gate 9 (in the figure, represented as ST negative voltage/TG OFF) are accumulated in the stacked-type photodiodes 5', 5" below the accumulation gate 8, respectively.

FIG. 6(*b*) shows a state in which, similarly to FIG. 5(*b*), the signal charge accumulated in the stacked-type photodiode 5' (PD1 in the figure) is flown into the floating junction 10 by opening the transfer gate 9 so that no charge remains in the stacked-type photodiode 5', and subsequently the transfer gate 9 is closed (in the figure, represented as ST negative voltage/TG OFF→OFF). The signal charge of the stacked-type photodiode 5" is maintained as it is by the electric potential barrier of the barrier region 16.

As shown in FIG. 3(*b*), in a state where a negative voltage or a zero voltage is applied to the transfer gate 9, a positive voltage is applied to the accumulation gate 8 to transfer the signal charge accumulated in the stacked-type photodiode 5" to the stacked-type photodiode 5' by way of the barrier region 16 which was once a barrier. FIG. 6(*c*) shows a state in which the accumulation gate 8 is thereafter returned to a negative voltage (in the figure, represented as ST positive voltage→negative voltage/TG OFF).

FIG. 6(*d*) shows a state in which, as shown in FIG. 5(*b*), while the accumulation gate 8 is kept at a negative voltage, the signal charge accumulated in the stacked-type photodiode 5' (PD1 in the figure) below the accumulation gate 8 is transferred to the floating junction 10 by applying a positive voltage to the transfer gate 9 so as to deepen the electric potential well, and subsequently the transfer gate 9 is closed (in the figure, represented as ST negative voltage/TG ON→OFF). In this manner, signal charges accumulated in the stacked-type photodiodes 5', 5" can be read out independently.

In the description on FIGS. 5(*b*) and 6(*b*), an explanation was given such that in reading out the signal charge from the stacked-type photodiode 5', in a state where a negative voltage is applied to the accumulation gate 8, a positive voltage is applied to the transfer gate 9 so as to transfer the signal charge to the floating junction 10. In this transferring, it is not necessary to apply a negative voltage to the accumulation gate 8, and a positive voltage of a level that does not cause any charge transfer between the stacked-type photodiodes 5', 5" may be applied, and the voltage of the accumulation gate 8 may be changed in synchronism with the voltage change of the transfer gate.

Second Embodiment

Figure 7:
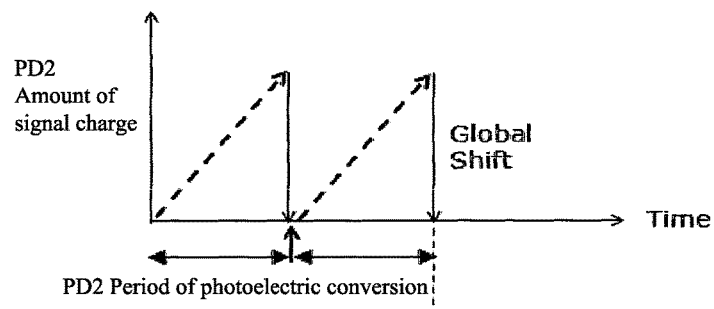
FIG. 7 is a chart to explain driving timing to achieve a global shutter mode according to a second embodiment where a stacked-type photodiode of the CMOS sensor of a backside-illumination type according to the first embodiment of the present invention is employed.
Figure 7:
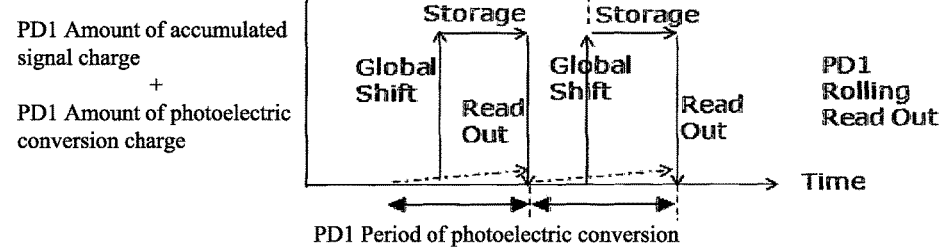

FIGS. 7(*a*) and 7(*b*) are charts to explain driving timing to achieve a global shutter function of a second embodiment where the stacked-type photodiode of the CMOS sensor according to the first embodiment, shown in FIG. 1, of the present invention is employed. Time changes of amounts of signal charges of the photodiode 5" (PD2) on the side of incident light and the photodiode 5' (PD1) on the side of the accumulation gate are shown in FIGS. 7(a) and 7(b), respectively.

FIG. 7(a) shows a time change of the amount of signal charge at the photodiode 5" (PD2) which is on the side of incident light. The amount of signal charge accumulated by photoelectric conversion of incident light increases as time proceeds. Then, after completion of a period of photoelectric conversion, as shown in FIG. 3(b), a positive voltage is applied to the accumulation gate so that the signal charge is transferred from the photodiode 5" (PD2) on the side of incident light to the photodiode 5' (PD1) on the side of the accumulation gate. The transferring of the signal charge is performed simultaneously for all pixels of the photodiodes 5" (PD2) on the side of incident light, which is linked to Global Shutter and represented as Global Shift in the figure.

FIG. 7(b) shows a time change of the amount of signal charge at the photodiode 5' (PD1) which is on the side of the accumulation gate. The signal charge transferred from PD2 by Global Shift is accumulated temporarily (in the figure, represented as Storage), and read out, by opening the transfer gate, to the floating junction as shown in FIG. 5(b) (in the figure, represented as Read Out). Timing of the reading out is sequential from an end for each horizontal scanning line of pixels similarly to that of reading out of a usual CMOS, and thus, is different for pixels depending on a distance from the end of the horizontal scanning line.

In FIG. 7(b), in addition to the amount of accumulated charge at PD1 (the amount of signal charge of PD2 transferred by Global Shift), an amount of charge is shown that is generated within PD1 by photoelectric conversion of infrared light component of incident light. Time change of this amount is represented by the chain line in the figure, and whose period of photoelectric conversion is from Read Out to the next Read Out and is equal to the period of photoelectric conversion of PD2.

An amount of read out charge from PD1 is a sum of the accumulated charge at PD1 (the amount of the signal charge of PD2 transferred by Global Shift) and the charge generated at PD1 by photoelectric conversion. The period of photoelectric conversion is the same for both, but the timing of photoelectric conversion is different depending on their locations in the horizontal scanning line of pixels. Thus, an output image is a composite image composed of an image of Global Shutter for photoelectric conversion of visible light component by PD2 and an image of Rolling Shutter for photoelectric conversion of infrared light component by PD1.

Generally, a color camera is usually provided with an infrared cut filter in order to conform to human luminous sensitivity. In the case of a general filter for cutting light of 650 nm or longer, when a depth of the barrier region is approximately 5 μm, an amount of charge generated at photodiode 5' (PD1) is no more than about 20% even at 650 nm. This was estimated based on FIG. 3 of Patent Document 3.

The amount of charge generated at PD1 by photoelectric conversion of infrared light component of incident light forms an image of Rolling Shutter, as described above. In order to reduce this component, the charge accumulated in PD1 can be discarded to the floating junction by opening the transfer gate immediately before Global Shutter. Note, however, even in this case a charge remains that is generated at PD1 by photoelectric conversion in the period of Storage starting at Global Shift and ending at Read Out.

FIGS. 8(a) and 8(b) show changes of amounts of signal charges of the photodiode 5" (PD2) on the side of incident light and the photodiode 5' (PD1) on the side of the accumulation gate in the driving timing to achieve a global shutter function shown in FIGS. 7(a) and 7(b). The transfer gate is opened immediately before Global Shift to discard, as shown in FIG. 5(b), the charge which has been generated at PD1 by photoelectric conversion and accumulated (in the figure, represented as Reset). A state where the transfer gate is closed thereafter is shown in FIG. 8(a). In this state, the signal charge generated at PD2 by photoelectric conversion is still accumulated.

Next, a positive voltage is applied to the accumulation gate to perform Global Shift, and the signal charge is transferred from PD2 to PD1; this state is shown in FIG. 8(b). Here, the transfer gate is kept closed (TG OFF).

Next, as shown in FIG. 8(c), the accumulation gate is returned to a negative voltage, and photoelectric conversion of incident light at PD2 and accumulation of signal charge at PD1 (in the figure, represented as Integration) are performed. The transfer gate is kept closed (TG OFF).

Next, at the timing of Read Out, the transfer gate is opened, as shown in FIG. 5(b), and the charge accumulated at PD1 is transferred to the floating junction. Note, however, even in this case a charge is added that is generated at PD1 by photoelectric conversion in the period of Storage starting at Global Shift and ending at Read Out. Meanwhile, at PD2, photoelectric conversion has been performed continuously since the timing at which Global Shift completes and the barrier is formed.

Third Embodiment

Figure 9:
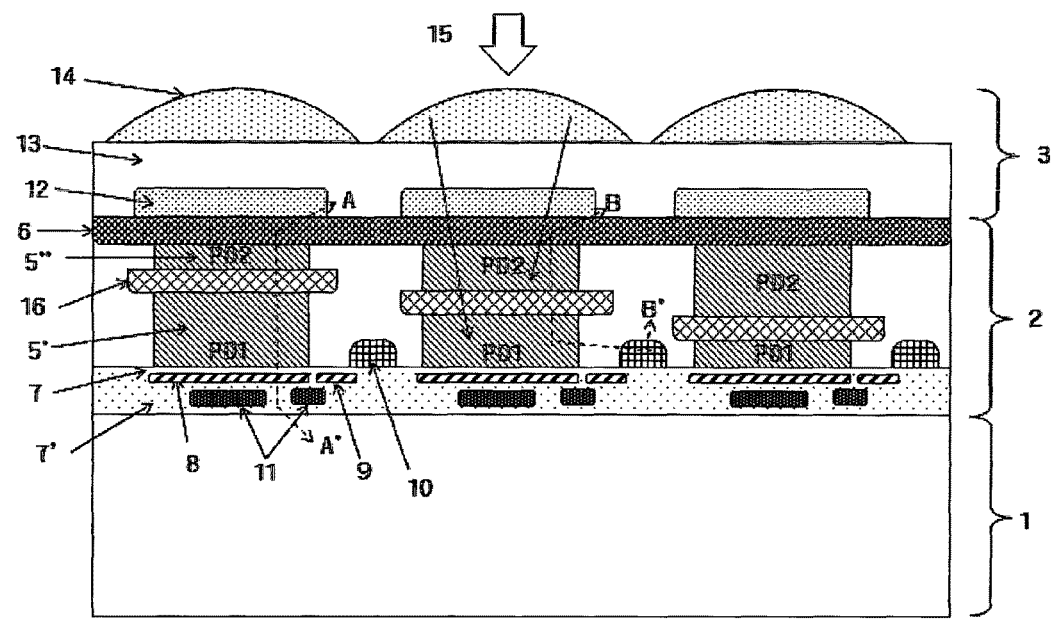
FIG. 9 is a schematic structure view of a CMOS sensor of a backside illumination-type according to a third embodiment of the present invention.

FIG. 9 is a schematic structure view of an example of a CMOS sensor according to a third embodiment of the present invention, and is a cross-sectional view of an example of a structure of a pixel portion. Difference from FIG. 1 is that, in this structure, the barrier regions 16 which separate the photodiodes 5', 5" are disposed at different locations in the direction of thickness. The stacked-type photodiodes are referred to as a photodiode 5' on the side of the accumulation gate and a photodiode 5" on the side of incident light similarly to FIG. 1, which are represented as PD1 and PD2 in the figure similarly.

By changing the location in the direction of thickness of the barrier region 16, which is for separating the stacked-type photodiodes 5', 5" in the vertical direction in FIG. 9, it is possible to change the spectral sensitivity characteristics of the stacked-type photodiode 5" (PD2) on the side of incident light. With respect to the distance from an interface (silicon top) of the surface shield layer 6 on the stacked-type photodiode 5" on the side of incident light to a position at which the electric potential of the barrier region 16 is shallowest (position represented by the vertical broken line (B) at the center of FIG. 6), an amount of charge generated by photoelectric conversion and accumulated at the stacked-type photodiode 5' varies depending on a wavelength of incident light and the sensitivity for longer wavelengths increases as the distance becomes large. A quantitative simulation of spectral sensitivity characteristics, in which a depth from a silicon surface is varied, is shown in FIG. 4 of Patent Document 3.

By changing the location in the direction of thickness of the barrier region 16, which is for separating the stacked-type photodiodes 5', 5" in the vertical direction in FIG. 9, it is possible to change also the spectral sensitivity characteristics of the stacked-type photodiode 5' (PD1) on the side of the accumulation gate. With respect to the distance from the position at which the electric potential of the barrier region 16 is shallowest (position represented by the vertical broken line (B) at the center of FIG. 6), to a silicon interface of the stacked-type photodiode 5' on the side of the accumulation gate, an amount of charge generated by photoelectric conversion and accumulated at the stacked-type photodiode 5' varies depending on a wavelength of incident light and the sensitivity for shorter wavelengths increases as the distance becomes large. An examples of a quantitative simulation of spectral sensitivity characteristics of a photodiode, in which a depth from a silicon surface to a region at which a charge is generated by photoelectric conversion and accumulated is varied, is shown in FIGS. 5 and 6 of Patent Document 3.

By making the location of the barrier region 16, which is for separating the stacked-type photodiodes 5', 5" vertically in FIG. 9, different in the direction of thickness for each pixel, it is possible to make the spectral characteristics of the stacked-type photodiodes 5' (PD1) on the side of the accumulation gate and the stacked-type photodiodes 5" (PD2) on the side of incident light of a pixel different for each pixel. While a color filter 12 of a respective color is formed on each pixel in FIG. 9, the location in the direction of thickness of the barrier region 16 for separating the stacked-type photodiodes 5', 5" is changed depending on a spectrum of the color filter 12 of each pixel. By doing so, it is possible to increase the degree of freedom to match the spectrum characteristics obtained from the stacked-type photodiodes 5', 5" of each color with a predetermined spectral characteristics by means of combination of the spectral characteristics of each color filter and the spectral characteristics of the stacked-type photodiodes 5', 5" of each pixel.

Figure 10:
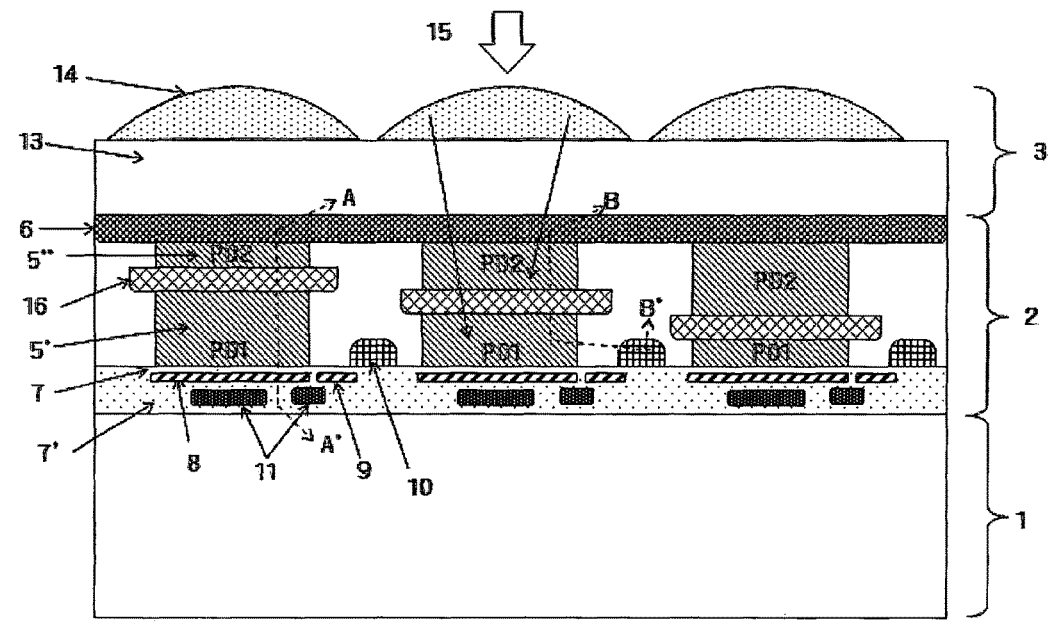
FIG. 10 is a schematic view of a structure in which a color filter is omitted from the backside illumination type according to the third embodiment.

Though a color filter 12 of respective color is formed on the stacked-type photodiode 5', 5" in FIG. 9, the color filter may be omitted, as shown in FIG. 10, and by disposing the barrier region 16 for separation at a different location in the direction of thickness for each pixel, the spectral characteristics of the stacked-type photodiodes 5', 5" are made different for each pixel, which makes it possible to obtain, without any color filters, color information in the visible light region as well as optical information in the infrared light region.

Fourth Embodiment

Figure 11:
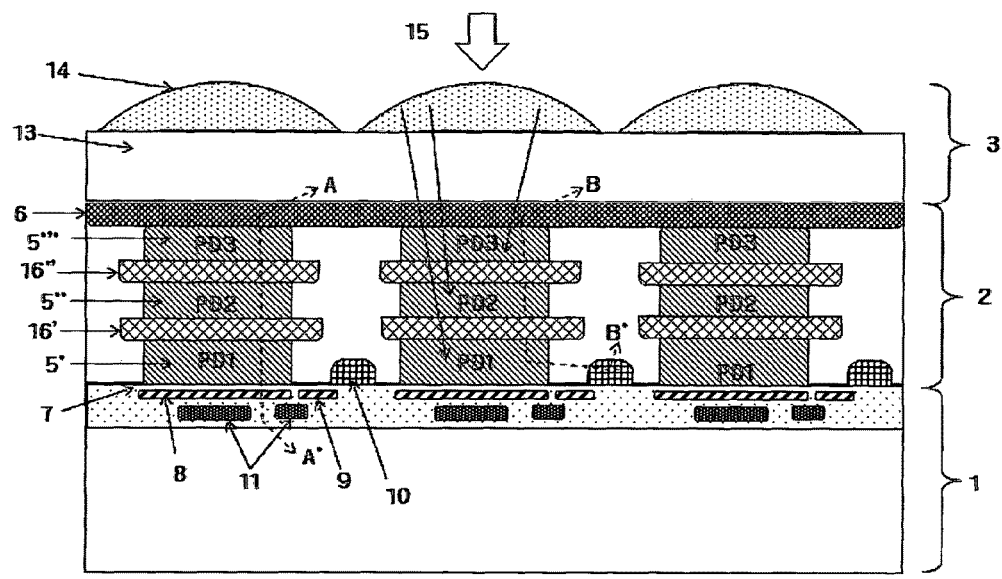
FIG. 11 is a schematic structure view of a CMOS sensor of a backside illumination-type according to a fourth embodiment of the present invention.

FIG. 11 is a schematic structure view of an example of a CMOS sensor according to a fourth embodiment of the present invention, and is a cross-sectional view of an example of a structure of a pixel portion. Difference from FIG. 1 is that, in this structure, one additional barrier region 16 is provided so that there are two barrier regions 16' and 16", and accordingly, the number of stacked-type photodiodes is three so that stacked-type photodiodes 5', 5", 5''' are present in the direction of thickness. This structure resembles that of FIGS. 1 and 2 of Patent Document 3. The structure of the pixel comprising the stacked-type photodiodes 5', 5", 5''' shown in FIG. 11 resembles that of a solid-state imaging device shown in FIG. 1 of Patent Document 3 which employs a system where color signals are obtained from three photodiodes disposed at different locations in the direction of depth.

Figure 8:
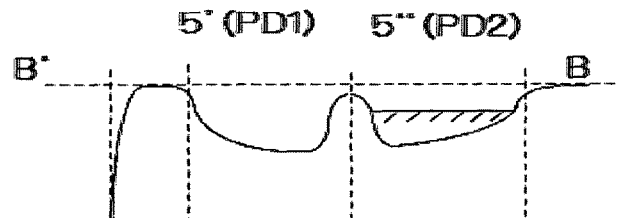
FIG. 8 is a chart to explain a transfer sequence of a signal charge between stacked-type photodiodes and a reading out sequence to a floating junction, with the timing of FIG. 7.
Figure 8:
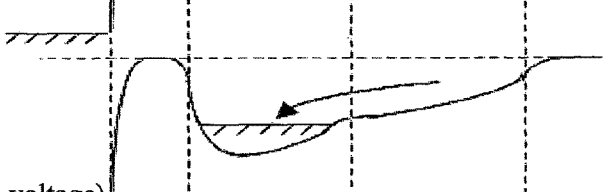
Figure 8:
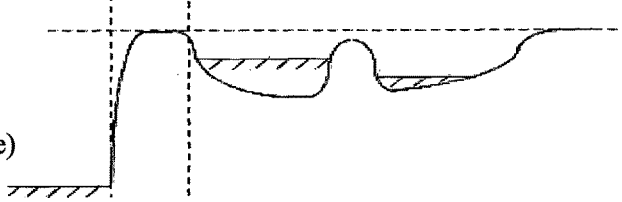

A major difference between the stacked-type photodiodes 5', 5", 5''' in three layers shown in FIG. 11 and the photodiodes in three layers in FIG. 1 of Patent Document 3 exists in the method of reading out a signal charge generated by photoelectric conversion and accumulate at each photodiode. That is, in the solid-state imaging device of Patent Document 3, paths for reading out signal charges from the photodiodes are provided independently of one another as shown in FIGS. 1 and 8 of Patent Document 3, whereas in the present invention shown in FIG. 11, no independent path for reading out is provided. Hereafter, the method of reading out signal charges in the present invention shown in FIG. 11 will be described.

Figure 12:
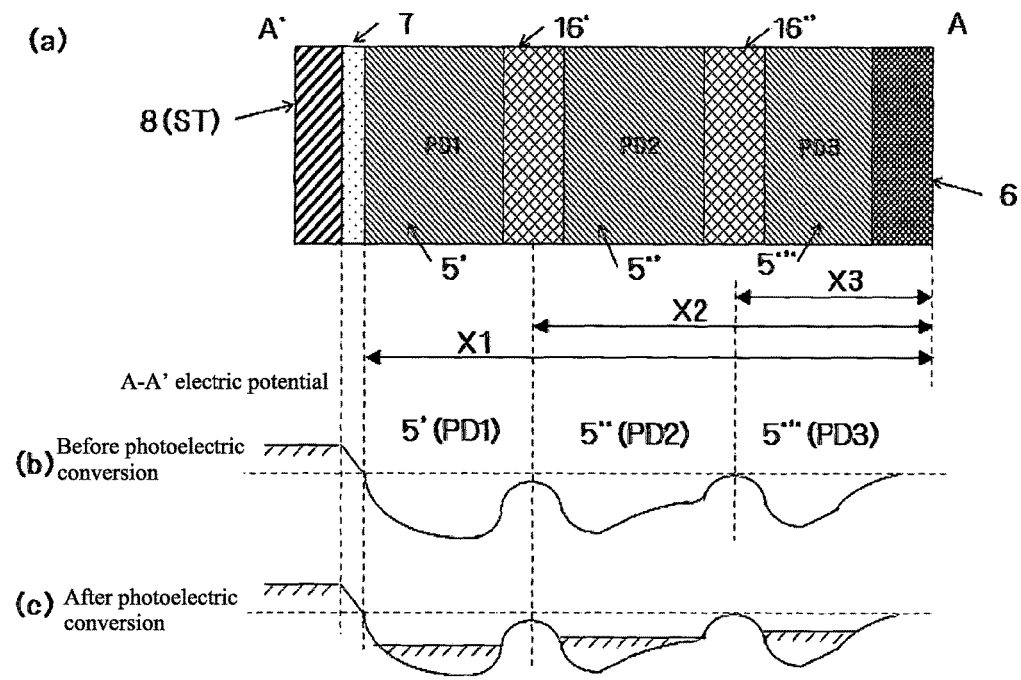
FIG. 12 is a chart showing a cross-sectional structure view at AA' of FIG. 11 and an electric potential well distribution corresponding to each region.

A structure of the barrier region 16', 16" and the stacked-type photodiodes 5', 5", 5''' at the section A-A' of FIG. 11 is shown in FIG. 12 (*a*) and profiles of electric potential wells corresponding to each of the regions are shown in FIGS. 12 (*b*) and 12 (*c*). What are shown in these figures correspond to states before and after photoelectric conversion while a negative voltage is applied to the accumulation gate 8, and are the electric potential wells and a state of accumulation of signal charges before signal charges are accumulated (FIG. 12(*b*)) in the stacked-type photodiodes 5' (PD1), 5" (PD2), 5''' (PD3), and after photoelectric conversion and accumulation of signal charges (FIG. 12 (*c*)).

As shown in FIG. 12(*b*), when a sufficiently negative voltage is applied to the accumulation gate 8, a surface pinning state is caused so that electric potential at the interface of the stacked-type photodiode 5' is zero (this situation is the same as FIG. 12(*b*)). On the other hand, a surface portion on the side of incident light of the stacked-type photodiode 5" (the surface on the right of FIG. 12(*a*)) is in contact with the surface shield layer 6 which is kept at zero electric potential. The profiles of the electric potential wells at the stacked-type photodiodes 5', 5", 5''' and the barrier regions 16', 16" in this state are those in FIG. 12(*b*), and the electric potential wells of the stacked-type photodiodes 5', 5", 5''' are separated by electric potential barriers of the barrier regions 16', 16". In FIG. 12(*a*), taking as a base the silicon interface on the side of the surface shield layer 6, a distance to a silicon interface on the side of the accumulation gate is represented as X1, and distances to the shallowest positions of the electric potential wells at the barrier regions 16', 16" are represented as X2 and X3, respectively.

In the profile of the electric potential well shown in FIG. 12(*b*), the signal charges generated by photoelectric conversion of incident light from the side of the surface shield layer are accumulated in the electric potential wells of the stacked-type photodiodes 5', 5", 5' as shown in FIG. 12(*c*). Amounts of the signal charges generated and accumulated at the stacked-type photodiodes 5', 5", 5''' depending on the distance from the surface of the surface shield layer are different from one another due to spectrum of the incident light. That is, if shorter wavelength components (blue) are dominant in the incident light, the amount of the signal charge accumulated at the stacked-type photodiodes 5''' (PD3) on the side of the surface shield layer increases, and if longer wavelength components (red) are dominant in the incident light, the amount of the signal charge accumulated at the stacked-type photodiodes 5' (PD1) on the side of the accumulation gate increases. Further, if medium wavelength components (green) are dominant in the incident light, the amount of the signal charge accumulated at the stacked-type photodiodes 5" (PD2) on the side of the accumulation gate increases.

Figure 13:
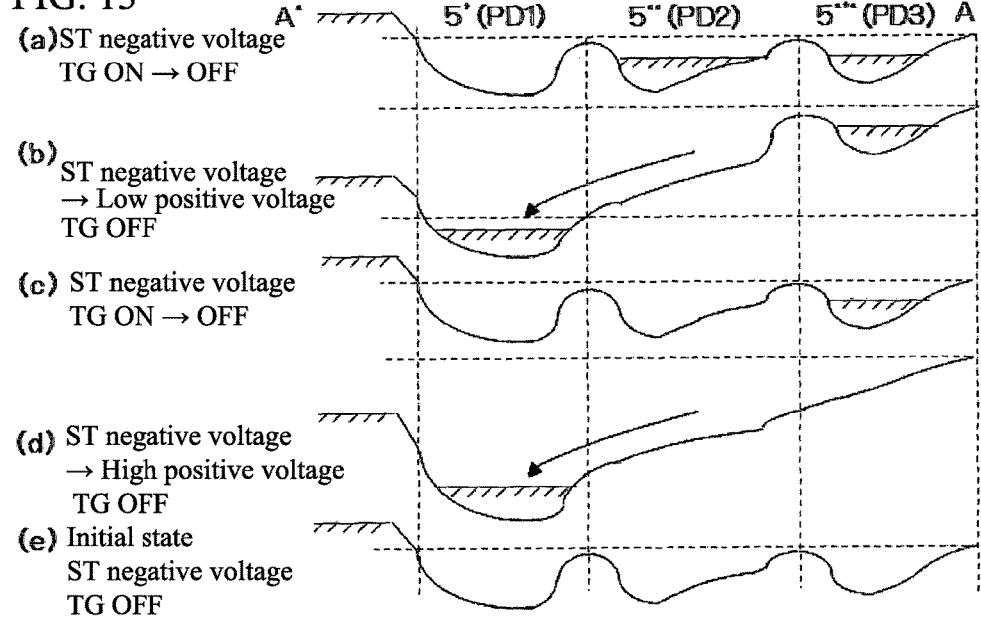
FIG. 13 is a chart to explain a method of transferring signal charges between a plurality of stacked-type photodiodes with the electric potential well distribution, shown in FIG. 12, of the stacked-type photodiodes of the CMOS sensor of a backside illumination type according to the fourth embodiment of the present invention.

FIGS. 13(*a*)-13(*e*) are charts to explain how the charges are transferred among the stacked-type photodiodes 5', 5", 5'''. The state of FIG. 12(*c*) is regarded as an initial state, i.e., the state in which signal charges generate by photoelectric conversion are accumulated, respectively, in the stacked-type photodiodes 5', 5", 5''' below the accumulation gate 8 in the case where a negative voltage is applied to the accumulation gate 8 and a negative voltage or a zero voltage is applied to the transfer gate 9.

From the initial state of FIG. 12(*c*), by opening the transfer gate (not shown in the figure), the signal charge accumulated in the stacked-type photodiodes 5' (PD1 in the figure) is allowed to flow into the floating junction 10 (not shown in the figure), so that no charge remains in the stacked-type photodiodes 5'. This is the same as the sequence shown in FIGS. 5(*a*) and 5(*b*). A state where the transfer gate is closed thereafter (in the figure, represented as ST negative voltage/TG ON→OFF) is shown in FIG. 13(*a*). The signal charges of the stacked-type photodiodes 5", 5''' are kept as they are by the electric potential barrier of the barrier regions 16', 16". This resembles the sequence shown in FIG. 6(*b*).

Similarly as shown in FIG. 3(*b*), while a negative voltage or a zero voltage is applied to the transfer gate 9, a positive voltage is applied to the accumulation gate 8 so as to transfer the signal charge accumulated in the stacked-type photodiodes 5" to the stacked-type photodiodes 5' by way of the barrier region 16' which was once a barrier. This state is shown in FIG. 13(*b*). Here, what is important is that even though the positive voltage applied to the accumulation gate 8 cancels the electric potential barrier of the barrier region 16', it keeps the electric potential barrier of the barrier region 16" so that the signal charge accumulated in the stacked-type photodiodes 5''' is kept as it is. This is represented in FIG. 13(*b*) as ST negative voltage→Low positive voltage/TG OFF.

Next, the accumulation gate 8 is returned to a negative voltage, and a positive voltage is applied to the transfer gate 9 (not shown in the figure) to deepen the electric potential well, so that the signal charge generated by PD2 and then transferred to and accumulated in the stacked-type photodiode 5' (PD1 in the figure) below the accumulation gate 8 is transferred to the floating junction 10, and thereafter the transfer gate 9 is closed (in the figure, represented as ST negative voltage/TG ON→OFF), which state is shown in FIG. 13(*c*).

Similarly as shown in FIG. 3(*b*), while a negative voltage or a zero voltage is applied to the transfer gate 9, a positive voltage is applied to the accumulation gate 8, so as to transfer the signal charge accumulated in the stacked-type photodiodes 5''' to the stacked-type photodiodes 5' by way of the barrier region 16' and the barrier region 16", which were once barriers. This state is shown in FIG. 13(*d*). Here, what is important is that the positive voltage applied to the accumulation gate 8 should be a high voltage such that it cancels both of the electric potential barriers of the barrier region 16' and the barrier region 16". This is represented in FIG. 13(*d*) as ST negative voltage→High positive voltage/TG OFF, as distinguished from FIG. 13(*b*).

Finally, the accumulation gate 8 is returned to a negative voltage, and a positive voltage is applied to the transfer gate 9 (not shown in the figure) to deepen the electric potential well, so that the signal charge generate by PD3 and then transferred to and accumulated in the stacked-type photodiode 5' (PD1 in the figure) below the accumulation gate 8 is transferred to the floating junction 10, and thereafter the transfer gate 9 is closed (in the figure, represented as ST negative voltage/TG ON→OFF), which state is shown in FIG. 13(*e*). This is the state before photoelectric conversion shown in FIG. 12 (*b*), and thus represented in the figure as Initial state. In the above-described manner, the signal charges accumulated in the stacked-type photodiodes 5', 5", 5''' can be read out independently.

In the description on FIGS. 13(*c*) and 13(*e*), an explanation was given such that in reading out the signal charges from the stacked-type photodiode 5', a positive voltage is applied to the transfer gate 9 while a negative voltage is applied to the accumulation gate 8 so that the signal charge is transferred to the floating junction 10. In the transferring, it is not necessary that the accumulation gate 8 is returned to a negative voltage and thereafter the transfer gate is opened; the transfer gate may be set in an open state first, and during the process of returning the voltage of the accumulation gate to a negative voltage, the charge may be transferred from the stacked-type photodiode 5' to the floating junction 10. Further, the signal charge may be transferred to the floating junction 10 by changing the pulse voltages applied to the accumulation gate 8 and the transfer gate 9 in synchronism.

Figure 14:
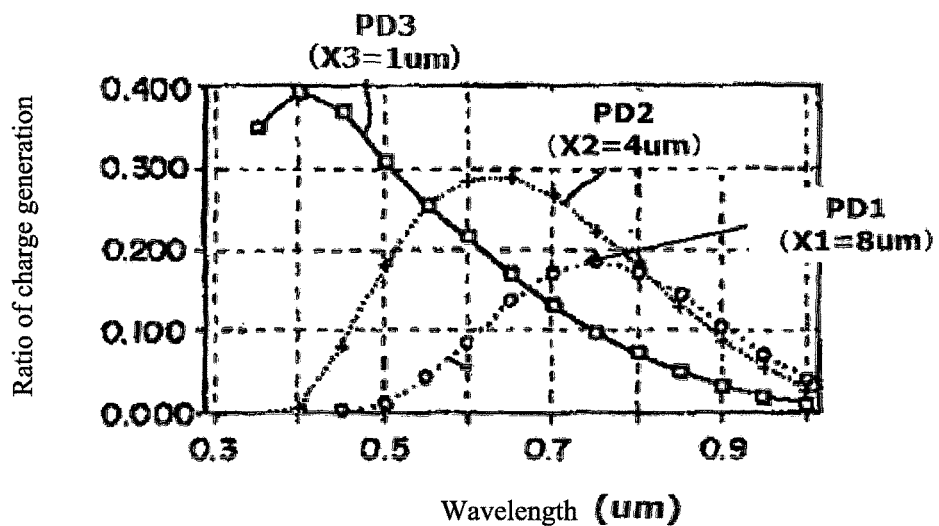
FIG. 14 is a chart to explain an example of spectral sensitivity characteristics in each of the stacked-type photodiodes of the CMOS sensor of a backside illumination type according to the fourth embodiment of the present invention shown in FIG. 11.

Specific values of the distances taking as the base the silicon interface on the side of the surface shield layer 6, shown in FIG. 12 (*a*), are $X1=8$ μm, $X2=4$ μm, $X3=1$ μm, as shown in FIG. 6 of Patent Document 3, and in the case of these values, the spectral sensitivity characteristics at the stacked-type photodiodes 5' (PD1), 5" (PD2), 5''' (PD3) are as shown in FIG. 14. The mathematical formula used for this calculation is Formula 3 of Patent Document 3.

Figure 15:
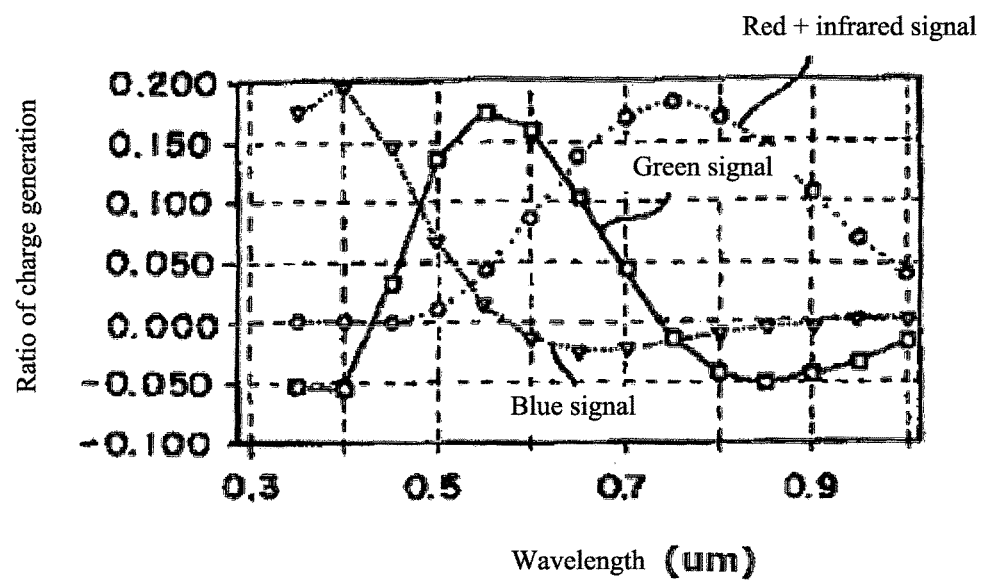
FIG. 15 is a chart showing spectral characteristics of color signals obtained through signal processing from the spectral sensitivity characteristics of each of the stacked-type photodiodes of FIG. 14.

FIG. 15 shows spectral characteristics of color signals obtained by performing signal processing on the spectral sensitivity characteristics at the stacked-type photodiodes 5' (PD1), 5" (PD2), 5''' (PD3) shown in FIG. 14. This is the same as the spectral waveform shown in FIG. 7 of Patent Document 3.

In the above description, material for the accumulation gate 8 was not referred to, however, polysilicon, which is usually used as a gate material, as well as metal silicide, and even a metallic material may be used for it. A metallic material generally has high reflectance to incident light, and in the structure of the present invention, incident light reaching the accumulation gate is reflected by a metallic film of the accumulation gate and enters the photodiode again, so that sensitivity for infrared light can be increased.

As described above, according to the structure of the present invention, by the voltage applied to the accumulation gate 8, transfer of the signal charge between the stacked-type photodiodes disposed in the direction of incident light can be controlled, allowing the signal charge to be read out to the floating junction by way of the same transfer gate for read out, so that it is not necessary to provide independent paths for read out, unlike the conventional examples disclosed in Patent Documents 2 and 3, and thus, a great advantage in integration of pixel cells can be obtained.

By the fact that spectral sensitivity characteristics of the stacked-type photodiode can be controlled according to the location of the barrier region, the present invention brings a new added value. That is, as shown in FIG. 1 or FIG. 9, when combined with a color filter, a combination of the spectral characteristics of the color filter and the spectral characteristics of the stacked-type photodiode are realized, so that a color sensor in which an infrared cut filter is omitted can be provided.

Further, as shown in FIG. 10 or FIG. 11, even without a color filter, spectral sensitivity characteristics of the stacked-type photodiodes are different, so that color images can be taken. That is, information of three primary colors can be obtained by one pixel cell, and additionally, it is not necessary to provide newly a path for read out in the lateral direction, so that reduction of cell size is easy, greatly facilitating reduction of chip size of an element.

In the fourth embodiment shown in FIG. 11, up to two barrier regions are provided, however, it is possible to provide tree or more barrier regions to separate the photodiode, forming four or more stacked-type photodiodes.

Fifth Embodiment

Figure 16:
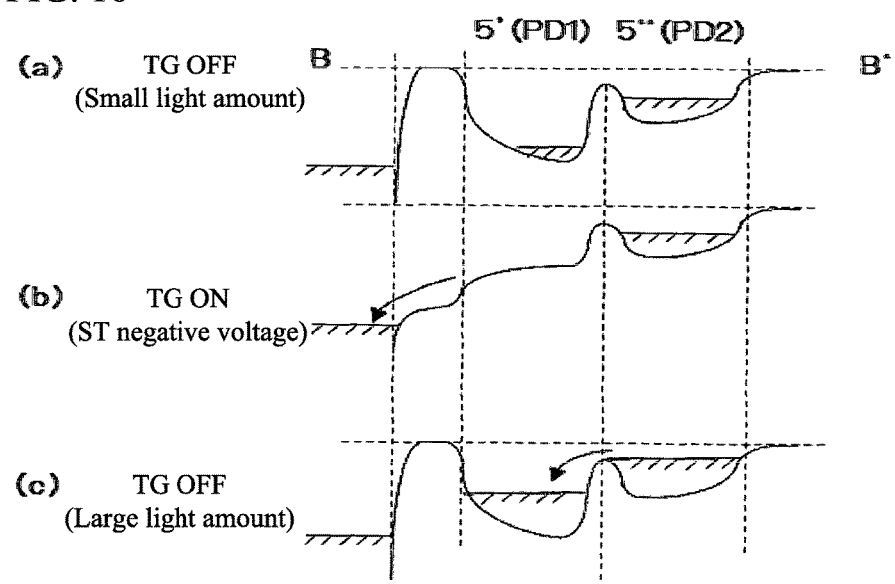
FIG. 16 is a chart to explain a method of reading out a signal charge in both cases of small light amount and large light amount, with the electric potential well distribution of each of the stacked-type photodiodes of the CMOS sensor of a backside illumination type according to a fifth embodiment of the present invention, where depth of the electric potential well of the stacked-type photodiode is varied.

FIG. 16 is a profile of an electric potential well of a CMOS sensor according to a fifth embodiment of the present invention. The profile of the electric potential wells along the section B-B' in FIG. 1 of the first embodiment of the present invention is shown in FIGS. 4(b) and 4(c), where the electric potential wells of the stacked-type photodiodes 5', 5" are substantially the same. In the fifth embodiment of the present invention, the electric potential well of the photodiode 5' (PD1) on the side of the accumulation gate is made deep and the electric potential well of the photodiode 5" (PD2) on the side of incident light is made shallow; a profile of these potential wells is shown in FIGS. 16(a)-16(c). Here, the electric potential barrier of the barrier region 16 is made deeper than zero electric potential.

FIG. 16(a) shows a case in which an amount of incident light is small, where signal charges are accumulated in both of the stacked-type photodiodes 5', 5", wherein the charge of the photodiode 5' (PD1) on the side of the accumulation gate is mainly a charge corresponding to infrared light, and the amount of the generate charge in a usual imaging system provided with an infrared cut filter is small compared to that of the photodiode 5" (PD2).

In a case where the amount of incident light is small, the charge generated by photoelectric conversion of visible light region is accumulated in photodiode 5" (PD2). In the case, in reading out, the charge accumulated at the photodiode 5' (PD1) on the accumulation gate is discarded outside by way of the floating junction by opening the transfer gate TG, as shown in FIG. 16(b). Specifically, the charge is discarded from a reset gate (not shown in the figure) adjacent to the floating junction to a reset drain (not shown in the figure). Next, a positive voltage is applied to the accumulation gate as shown in FIG. 3(b), and the charge of photodiode 5" (PD2) is transferred to the photodiode 5' (PD1), and the charge is further transferred from the transfer gate to the floating junction, to achieve reading out of the charge.

FIG. 16(c) shows a case in which an amount of the incident light is large. The charge generated at the photodiode 5" (PD2) on the side of incident light but cannot be accumulated there any more flows over the electric potential barrier of the barrier region into the photodiode 5' (PD1) on the side of the accumulation gate and is accumulated there. After the photoelectric conversion, a positive voltage is applied to the accumulation gate, and the charge is transferred from the photodiode 5" (PD2) to the photodiode 5' (PD1) so as to join with the charge having been accumulated in the photodiode 5' (PD1), and thereafter, the transfer gate is opened to transfer the conflated charges to the floating junction for reading out.

The conflation of the charges may be performed at the photodiode 5' (PD1) on the side of the accumulation gate as described above, however, it may be performed in the following alternative way: the transfer gate is opened to transfer the charge of the photodiode 5' (PD1) to the floating junction, subsequently a positive voltage is applied to the accumulation gate to transfer the charge from the photodiode 5" (PD2) to the photodiode 5' (PD1), then the transfer gate is opened again to cause the charges to join together at the floating junction.

In the case where the amount of the incident light is small, photoelectric conversion of visible light region and accumulation of the charge is performed only at the photodiode 5" (PD2). Therefore, only a leak current at the photodiode 5" (PD2) is superimposed, but a leak current at the photodiode 5' (PD1) is not superimposed, and thus degradation of S/N is suppressed. On the other hand, in the case where the amount of the incident light is large, charges are accumulated at both of the photodiodes 5" (PD2) and 5' (PD1), so that leak currents of the both photodiodes are superimposed, however, since an amount of the signal charge is large, an original S/N is realized.

In the above description, read out of the signal charge from the stacked-type photodiode on the side of the accumulation gate is performed by way of the same transfer gate and from the floating junction, however, a plurality of transfer gates may be provided at the stacked-type photodiode on the side of the accumulation gate, and a transfer direction may be switched according to the order of the stacked-type photodiodes, or signal charges from adjacent pixels may be joined together at the floating junction.

In the above description, the surface of the stacked-type photodiode on the side of incident light is covered with the surface shield layer which is kept at zero electric potential, however, a gate structure may be employed instead of the surface shield layer. In this case, as a gate material, it is preferable to use a transparent electrode material which hardly absorbs incident light. In the transparent electrode structure, in order to achieve a surface pinning state, application of a negative voltage is preferable in a state where a signal charge is accumulated, however, in a transfer state, it is possible to apply a pulse to assist transferring of the charge between the stacked-type photodiodes.

Though explanations are given on a CMOS sensor in the above description, according to the present invention, a similar photodiode structure can be employed for a CCD sensor.

DESCRIPTION OF THE REFERENCE NUMERALS

1: substrate supporting member, 2: sensor layer, 3: color filter layer, 4: P well layer, 5: photodiode (PD), 5', 5", 5'": stacked-type photodiode (PD1, PD2, PD3), 6: surface shield layer, 7, 7': gate insulator film, 8: accumulation gate (ST), 9: transfer gate (TG), 10: floating junction, 11: wiring layer, 12: color filter, 13: transparent layer, 14: micro lens, 15: incident light, 16, 16', 16": barrier layer.

What is claimed is:

1. A backside illumination-type solid-state imaging device having photodiodes to accumulate signal charges generated by photoelectric conversion, the photodiodes being arranged in a matrix, comprising:
    an accumulation gate of a MOS type provided, via an insulator film, on an upper portion of said photodiode exposed on an opposite side to incident light;
    a stacked-type photodiode having a double-layered structure including a first photodiode located on a side of the accumulation gate and a second photodiode located on a side of an incident light surface which are separated by an impurity region of an opposite conductivity type to that of said photodiode, the impurity region extending in a plane orthogonal to the incident light; and a transfer gate provided adjacent to said accumulation gate;

wherein said stacked-type photodiode is configured such that application of a pulse voltage to said accumulation gate causes a signal charge to be transferred between said stacked-type photodiodes; and wherein the first photodiode is configured to accumulate a signal charge independently from the second photodiode.

2. A backside illumination-type solid-state imaging device having photodiodes to accumulate signal charges generated by photoelectric conversion, the photodiodes being arranged in a matrix, comprising:

an accumulation gate of a MOS type provided, via an insulator film, on an upper portion of said photodiode exposed on an opposite side to incident light;

a stacked-type photodiode including three or more layers into which said photodiode is separated by a plurality of impurity regions of an opposite conductivity type to that of said photodiode, the impurity regions extending in planes orthogonal to the incident light and being at different locations from a surface on the side of the incident light; and a transfer gate provided adjacent to said accumulation gate;

wherein said stacked-type photodiode is configured such that application of a pulse voltage to said accumulation gate causes a signal charge to be transferred between said stacked-type photodiodes; and wherein the photodiodes are configured to accumulate a signal charge independently from each other.

3. A backside illumination-type solid-state imaging device having photodiodes to accumulate signal charges generated by photoelectric conversion, the photodiodes being arranged in a matrix, comprising:

an accumulation gate of a MOS type provided, via an insulator film, on an upper portion of said photodiode exposed on an opposite side to incident light;

a stacked-type photodiode having a double-layered structure including a first photodiode located on a side of the accumulation gate and a second photodiode located on a side of an incident light surface which are separated by an impurity region of an opposite conductivity type to that of said photodiode, the impurity region extending in a plane orthogonal to the incident light; and a transfer gate is formed adjacent to said accumulation gate;

wherein transferring of a signal charge from the second photodiode on the side of the incident light to the first photodiode on the side of the accumulation gate is performed simultaneously at said plurality of photodiodes by applying pulse voltages simultaneously to a plurality of accumulation gates corresponding to a plurality of stacked-type photodiodes arranged in a matrix, and operation of each of the transfer gates is performed in a row base of the matrix to read out the signal charges sequentially; and wherein the first photodiode is configured to accumulate a signal charge independently from the second photodiode.

* * * * *